US 8,724,088 B2

United States Patent
Lin et al.

(10) Patent No.: US 8,724,088 B2
(45) Date of Patent: *May 13, 2014

(54) PELLICLE MOUNTING APPARATUS AND ASSEMBLY WITH PELLICLE MOUNTED ON MASK

(75) Inventors: Jiin-Hong Lin, Jhubei (TW); Chih-Chen Chen, Hsin-Chu (TW); Ming-Tao Ho, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/588,844

(22) Filed: Aug. 17, 2012

(65) Prior Publication Data

US 2012/0308922 A1  Dec. 6, 2012

Related U.S. Application Data

(63) Continuation of application No. 12/359,752, filed on Jan. 26, 2009, now Pat. No. 8,268,514.

(51) Int. Cl.
*G03B 27/64* (2006.01)
*G03F 1/14* (2006.01)

(52) U.S. Cl.
USPC .................................. 355/76; 355/75; 430/5

(58) Field of Classification Search
USPC .......................................... 430/5; 355/75, 76
See application file for complete search history.

(56) References Cited

U.S. PATENT DOCUMENTS

| | | | |
|---|---|---|---|
| 5,311,250 A * | 5/1994 | Suzuki et al. | 355/76 |
| 6,264,773 B1 * | 7/2001 | Cerio | 156/64 |
| 6,593,034 B1 * | 7/2003 | Shirasaki | 430/5 |
| 6,715,495 B2 | 4/2004 | Dao et al. | |
| 6,734,443 B2 | 5/2004 | Zheng et al. | |
| 2002/0085183 A1 | 7/2002 | Wu et al. | |
| 2004/0200572 A1 | 10/2004 | Tejnil et al. | |

OTHER PUBLICATIONS

Official Action issued Oct. 26, 2012 in counterpart Taiwan Patent Application.
Official Action issued May 30, 2012 in counterpart Chinese Patent Application.

* cited by examiner

*Primary Examiner* — Jonathan Jelsma
(74) *Attorney, Agent, or Firm* — Duane Morris LLP

(57) ABSTRACT

An apparatus is provided for mounting a pellicle to a photomask. A chamber has at least one port for filling the chamber with extreme clean dry air (XCDA) or an inert gas. A pellicle mounter is provided within the chamber. The mask is irradiated with a vacuum ultra violet (VUV) light in an atmosphere of the XCDA or inert gas, and the pellicle is mounted to the mask while the mask is in the atmosphere of the XCDA or inert gas and exposed to the VUV light. An assembly includes the mask attached to a pellicle frame by a pressure sensitive adhesive; and a pellicle joined to the pellicle frame, forming a sealed enclosure, the sealed enclosure being filled with extreme clean dry air (XCDA) or inert gas.

15 Claims, 5 Drawing Sheets

PELLICLE MOUNTING APPARATUS AND ASSEMBLY WITH PELLICLE MOUNTED ON MASK

RELATED APPLICATION(S)

This application is a continuation application of U.S. patent application Ser. No. 12/359,752, filed on Jan. 26, 2009, the contents of which are hereby incorporated by reference as if set forth in their entirety.

TECHNICAL FIELD

The present disclosure relates to methods and apparatus for mounting a pellicle to a photomask, and an assembly including a photomask and pellicle.

BACKGROUND

A reticle or photomask is a precision glass plate containing circuit layouts for use in a semiconductor fabrication process. If any dust or contaminant particles become attached to the reticle, such particles may result in artifacts on the printed circuits. A pellicle is a thin piece of transparent material mounted at a distance from the mask (reticle). The distance is chosen so that any dust or particles on the pellicle are out of focus when the wafer is in focus. Thus, any foreign particles that have fallen on the surface of the pellicle are not projected on the wafer, and do not contribute to printing defects.

Even with the use of a pellicle, other factors contribute to printing defects. One of these problems is reticle haze. It is well-known that haze is caused by the chemicals, SOx & NHx (e.g., $SO_2$ and $NH_3$) which are generated during the mask making process, and react with moisture. These chemicals may result from outgassing of materials used in making the masks, wet chemicals including sulphuric acid and hydrogen peroxide, and/or impurities from handling the masks. When these chemicals and moisture are present and exposed to ultraviolet (UV) light (such as the light used to expose a pattern onto a wafer), ammonium sulfate crystals grow, causing reticle haze. Thus, the life of the reticle can be shortened by formation of reticle haze crystals, which increase each time the mask is exposed to DUV (deep UV) light.

In order to retard or prevent the formation of haze, foundries have stored masks in controlled environments (e.g., storage in an inert gas) and employed "purge" operations to remove contaminants. A purge operation typically places the mask in an environment of pure nitrogen or extreme clean dry air (XCDA). Both of these environments can remove moisture and ammonia reactants from the mask, to avoid haze formation. For example, a purge operation may be performed immediately before and immediately after using the mask in a scanner.

U.S. Pat No. 6,593,034 describes a pellicle frame having two gas passage openings. The pellicle frame is adapted for replacing the air in the space between the mask and the pellicle with an inert gas, such as nitrogen, helium, argon or the like. The frame has a pair of openings, for feeding the inert gas into the space and for exhausting the gas from the space. The openings have filters which prevent subsequent infiltration of large particles. This configuration eliminates haze at the time the pellicle is mounted, but haze can still form subsequently during use.

Thus, improved methods of preventing reticle haze are desired.

SUMMARY

In some embodiments, an apparatus for mounting a pellicle to a photomask is provided. The apparatus comprises: a chamber having at least one port for filling the chamber with extreme clean dry air (XCDA) or an inert gas; a pellicle mounter within the chamber, configured to mount a pellicle to a mask by directly attaching a frame of the pellicle to the mask with a pressure sensitive adhesive; and a vacuum ultra violet light source for irradiating the mask held by the pellicle mounter while the chamber is filled with the XCDA or inert gas and while the frame is directly attached to the mask.

In some embodiments, an assembly is provided. The assembly comprises: a mask, a pellicle frame sealingly attached directly to the mask by a pressure sensitive adhesive; a pellicle joined to the pellicle frame, forming a sealed enclosure bounded by the mask, the pellicle frame and the pellicle, the sealed enclosure being filled with an inert gas, wherein the assembly is formed by: irradiating the mask with a vacuum ultraviolet (VUV) light in an atmosphere of extreme clean dry air (XCDA) or inert gas, and sealing the mask, the pellicle frame and the pellicle together using a pressure sensitive adhesive while the mask is in the atmosphere of XCDA or inert gas and exposed to the VUV light in the atmosphere of XCDA or inert gas.

In some embodiments, an assembly comprises: a mask, a pellicle frame sealingly attached directly to the mask by a pressure sensitive adhesive; and a pellicle joined to the pellicle frame, forming a sealed enclosure bounded by the mask, the pellicle frame and the pellicle, the sealed enclosure being filled with extreme clean dry air (XCDA) or inert gas.

DETAILED DESCRIPTION

Figure 1:
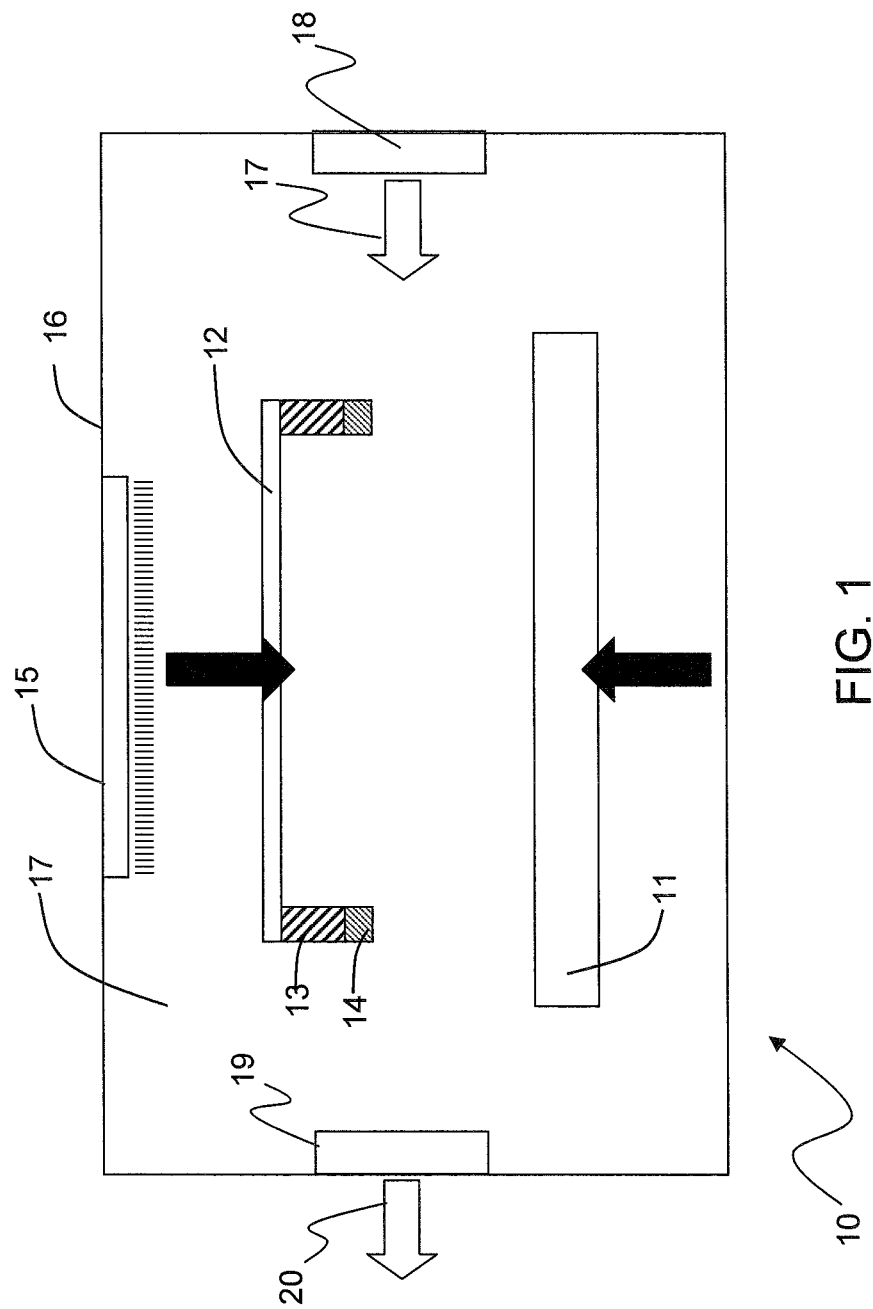
FIGS. 1 and 2 are schematic diagrams of a process for mounting a pellicle on a mask.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 2:
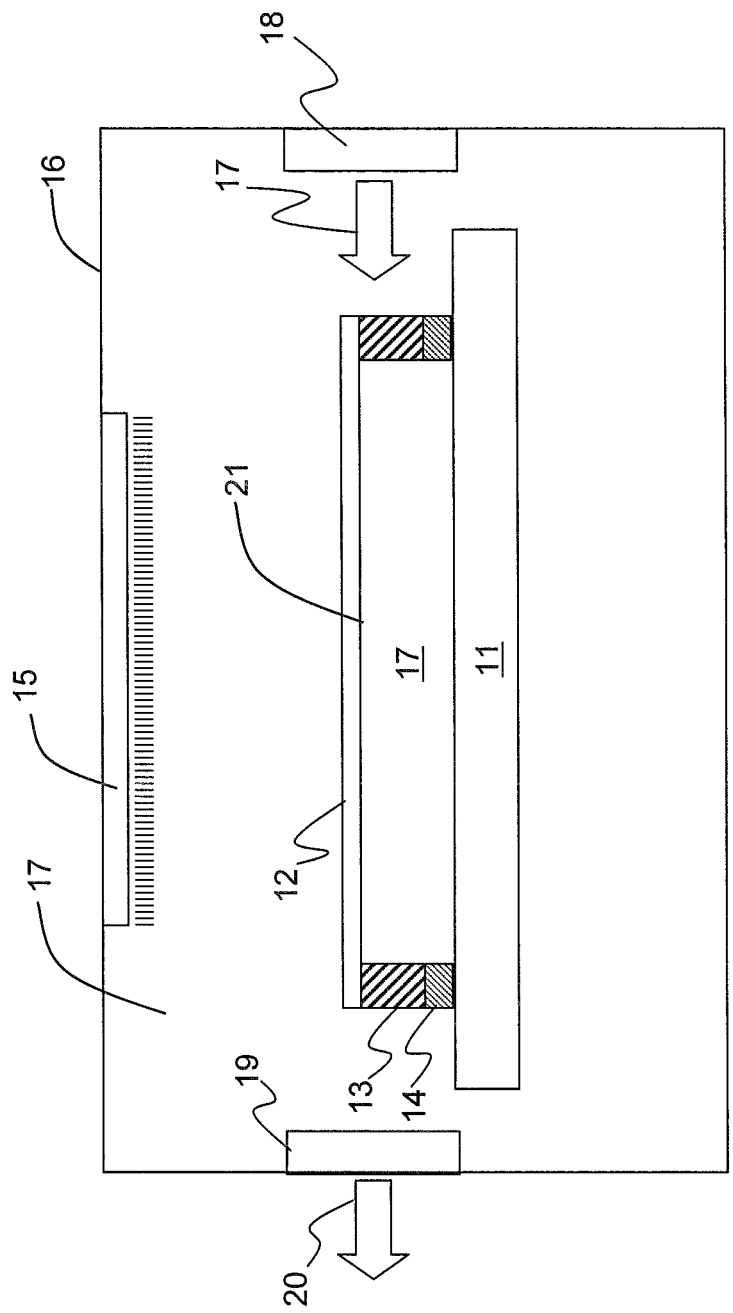

FIGS. 1 and 2 are schematic diagrams of a process for mounting a pellicle 12 to a photomask 11. FIG. 1 shows the pellicle 12 and pellicle frame 13 above the photomask 11 in preparation for joining the pellicle frame 13 to the photomask 11. FIG. 2 shows the photomask 11, pellicle frame 13, and pellicle 12 joined together.

The method includes irradiating a mask 11 with a vacuum ultra violet (VUV) light 15 in an atmosphere of extreme clean dry air (XCDA) or an inert gas 17, and mounting a pellicle 12 to the photomask 11 while the photomask 11 is in the atmosphere of XCDA or the inert gas 17 and exposed to the VUV light.

The mask 11 may be made of a suitable transparent material such as glass, quartz, or CaF2, upon which a pattern is formed of an opaque material, such as chrome. If the mask is a phase-shifting mask, a phase shifting layer is provided below the chrome layer. In some embodiments, the phase shift layer may include any element selected from among transition metals, lanthanoids and combinations thereof Examples include, Mo, Zr, Ta, Cr and Hf. In one example, the metal containing layer is formed of either MoSi, MoSiON or Cr.

The pellicle 12 may be one of a variety of types, such as Film 703 Deep UV film sold be by Micro Lithography, Inc. (MLI) of Sunnyvale, Calif., which has a high transmittance for 193 nm, 248 nm, and 365 nm wavelength light. Other pellicle materials that may be used include, but are not limited to, nitrocellulose, fluororesin, "CYTOP" manufactured by Asahi Glass Co., Ltd. of Tokyo, Japan, "FLON AF" resin manufactured by DuPont Kabushiki Kaisha, of Tokyo, Japan, plastic resin, synthetic quartz glass, or the like. The pellicle may be from about 2 μm thick to about 5 μm thick, but these are only examples, and other thicknesses may be used.

A pellicle frame 13 is to be mounted between the photomask 11 and the pellicle 12. The pellicle frame may be made of a variety of rigid materials, such as aluminum or plastic. The frame 13 may be a round or rectangular frame, with a suitable thickness which may be from about 6 mm (¼ inch) to about 11 mm (7/16 inch). Other suitable thicknesses may be used to provide rigidity and to maintain the top surface of pellicle 11 (the surface further from the mask 11) at a suitable distance from the mask, so that particles on the pellicle 11 do not form defects in the wafer pattern during scanning. The pellicle film 12 is stretched to remove slack and adhered to the pellicle frame 13 with an adhesive, such as a 1 μm film of fluorocarbon resin.

A suitable adhesive 14 is used to attach the pellicle frame 13 to the photomask 11. For example, adhesive 14 may be a pressure sensitive adhesive.

The photomask 11 and pellicle 12/frame 13 assembly are joined inside an enclosure or chamber 16. In some embodiments, the enclosure 16 may be sealable. The chamber 16 has at least one port 18, and may optionally have a second port 19. In an embodiment having a single port 18, the single port 18 is used to first evacuate the chamber 16 to vacuum pressure, and then to fill the chamber 16 with a desired atmosphere 17 (e.g., an extreme clean dry air (XCDA), or an inert gas, such as nitrogen, helium, argon or the like). In other embodiments with two ports 18, 19, an outlet port 19 is used to vacuum out the air 20 from the chamber 16, and an inlet port 18 is then used to feed a desired atmosphere 17 (e.g., an inert gas, such as nitrogen) into the chamber 16. The XCDA or inert gas may be supplied for a period of time to flush out any remaining oxygen, moisture and other undesired components. The ports 18 and 19 may have any suitable gas valves, and may be manually or automatically controllable.

A vacuum UV light source 15 is provided in the chamber 16. The light may be provided by an ArF excimer laser at 193 nm wavelength, or a xenon (Xe) excimer laser at 172 nm wavelength.

In a preferred assembly method, the undesired chemicals inside the space 21 enclosed between the photomask 11, pellicle 12 and frame 13 are exposed to VUV light and purged by XCDA or an inert gas 17, such as pure nitrogen, helium, or argon, during the pellicle mounting process. After the photomask 11, and pellicle 12 with frame 13 attached are placed in the chamber 16, the chamber 16 is evacuated through exhaust port 19 and then flushed with the XCDA or inert gas 17 for a sufficient period of time to exhaust all air from the chamber 16. Either before or while the chamber 16 is being flushed with the XCDA or inert gas 17, the VUV light source 15 is turned on. Thus, the portion of the atmosphere 17 between the photomask 11 and the pellicle 12 is irradiated with the light from the VUV light source 15 before, during and after the step of attaching the pellicle frame 13 to the photomask 11. In this way, the source for "growing Haze" is eliminated.

The XCDA or inert gas 17 inside the chamber is pressurized before, during and after the joining step, so that sealing the pellicle frame 13 to the photomask 11 creates a pressurized enclosure 21 filled with the XCDA or inert gas. By pressurizing the enclosed atmosphere 17 in the space 21 between the photomask 11 and pellicle 12, the subsequent ingress of atmospheric air or chemical vapors into the space 21 is avoided. The adhesive 14 between the photomask 11 and pellicle frame 13 forms a first hermetic seal, and the adhesive joining the pellicle 12 to the frame 13 forms a second hermetic seal, to prevent both ingress of air and chemicals into the space 21 and egress of the XCDA or inert gas 17 from space 21.

In some embodiments, an automated pellicle mounter is installed in the chamber 16. The pellicle mounter may be an 8000 series pellicle mounter by Micro Lithography, Inc. (MLI) of Sunnyvale, Calif., but other pellicle mounters may be used. For example, pellicle mounters of the types described in any one of U.S. Pat. No. 4,637,713 (Shulenberger et al.), U.S. Pat. No. 5,311,250 (Suzuki et al.) or U.S. Pat. No. 6,619,359 (Ballard et al.) may be used. The pellicle mounter may be controlled manually or automatically. Manual control may be provided by way of an additional port (not shown) in chamber 16. An automatically controlled pellicle mounter may be operated using an on-board battery for power, or power may be supplied through a power terminal (not shown) in the chamber 16. The apparatus may operate on a timer, or may be controlled via a wired or unwired interface.

The pellicle mounter may be of a type adapted to mount a single pellicle on one side of the photomask, or of a type that mounts a pair of pellicles on both sides of the photomask.

FIG. 2 shows the finished product comprising a mask 11, a pellicle frame 13 sealingly attached to the mask 11, and a pellicle 12 joined to the pellicle frame 13. A sealed enclosure 21 is formed, and is bounded by the mask 11, the pellicle frame 13 and the pellicle 12. The sealed enclosure 21 is filled with an inert gas 17. The assembly has been formed by irradiating the mask 11 with a vacuum ultraviolet light (e.g., having a wavelength of 193 nm or 172 nm) in an XCDA or inert gas atmosphere 17, and sealing the mask 11, the pellicle frame 13 and the pellicle 12 together in the XCDA or inert gas atmosphere 17.

Figure 3:
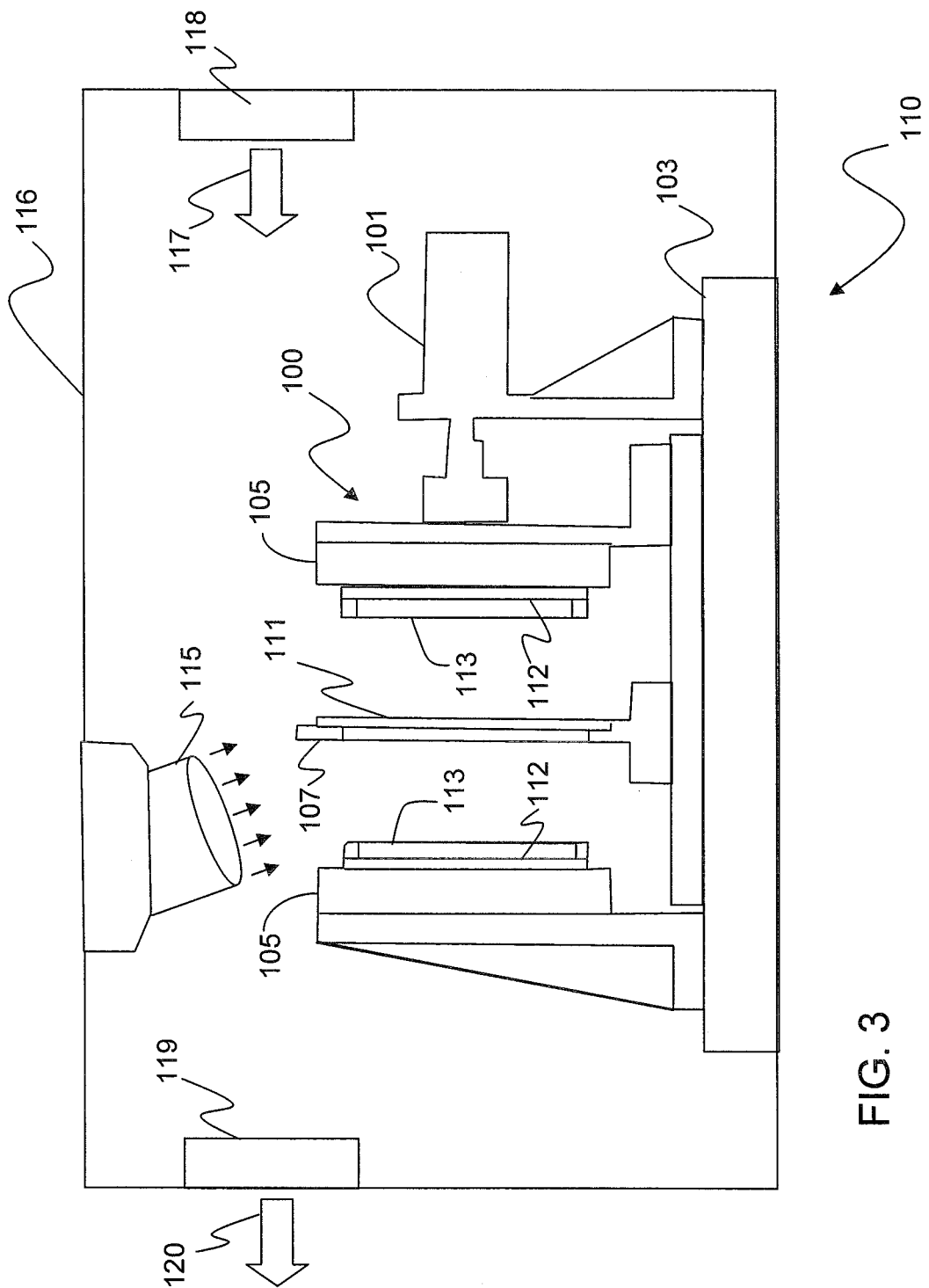
FIG. 3 is a diagram of a pellicle mounter capable of mounting pellicles on both sides of a mask.
Figure 4:
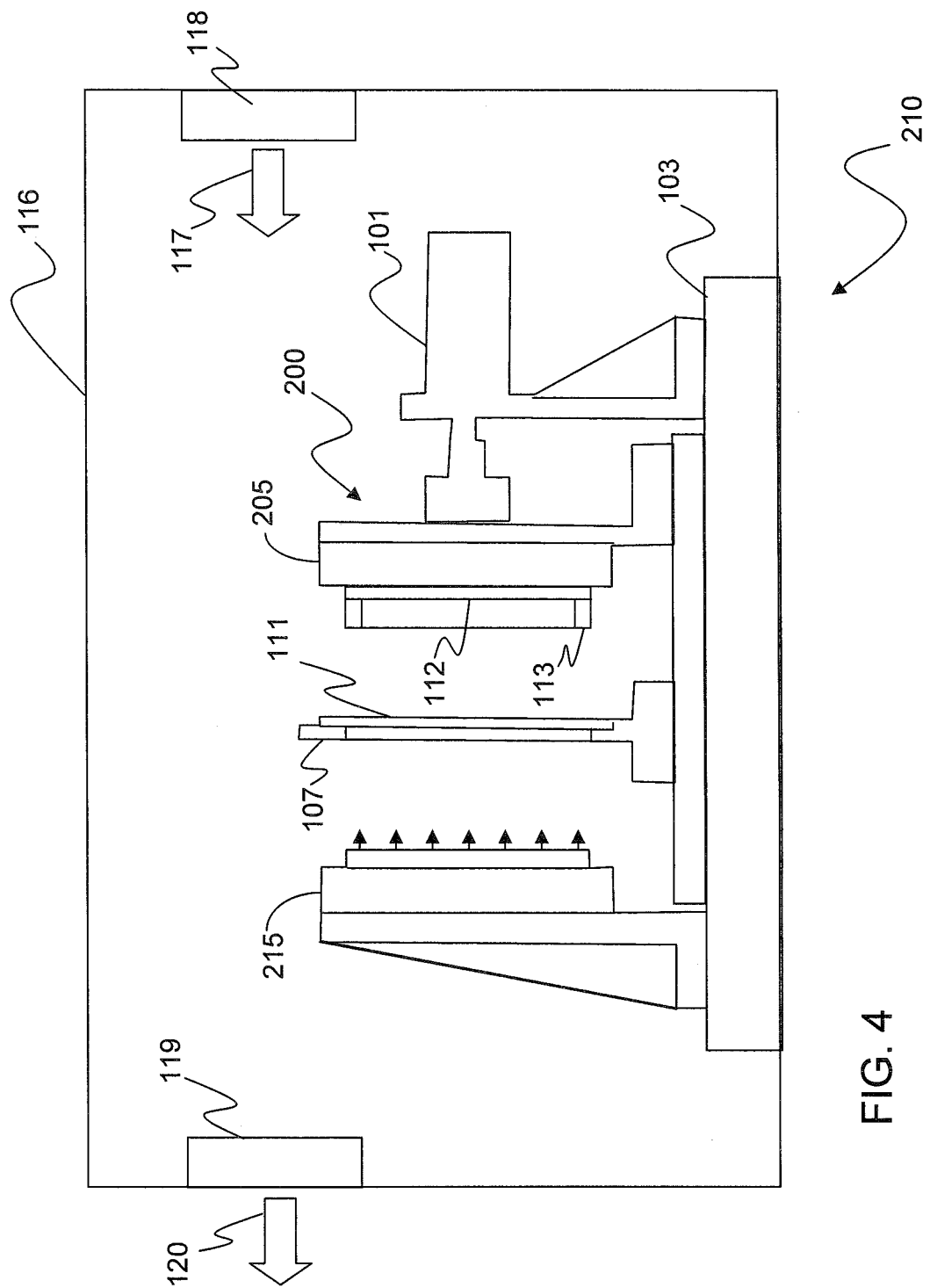
FIG. 4 is a diagram of a variation of the apparatus in FIG. 3.

FIG. 3 is a diagram of another apparatus 110 for mounting a pellicle 112 to a photomask 111. The pellicle mounter of FIG. 3 is of a type described in U.S. Pat. No. 5,311,250, but this is only an example, and other pellicle mounters may be used. The pellicle mounter 100 of FIG. 3 is capable of mounting pellicles 112 on both sides of photomask 111, but a variety of other pellicle mounters may be used.

The apparatus 110 includes a sealable chamber 116 having at least one port 118, 119 for filling the sealable chamber 116 with XCDA or an inert gas 117. A pellicle mounter 100 is provided within the sealable chamber 116. A vacuum ultra violet light source 115 is provided for irradiating a mask 111 held by a mask holder 107 of the pellicle mounter 100 while the chamber 116 is filled with the XCDA or inert gas 117.

The VUV light source 115 is positioned above the photomask 111 at an oblique angle, to permit irradiation with the pellicles 113 on both sides of the photomask 111. The light source provides light having a wavelength or 172 nm or 193 nm. For example, the light source 115 may be a Xenon excimer laser.

The chamber 116 has a first port 118 for charging the sealable chamber 116 with XCDA or an inert gas 117, and a second port 119 for evacuating air 120 and contaminants from the sealable chamber. A steady flow of the XCDA or inert gas 117 can be maintained to flush out any remaining impurities from the mask 111.

The pellicle mounter 100 has a controller 101, and is capable of automatic operation, either under control of an internal timer in controller 101, or a wired or wireless communication link with a processor (not shown). Power may be supplied to the pellicle mounter through a connection (not shown) in the base 103, or by a battery (not shown) for example.

In the example of FIG. 3, the VUV light source 115 is positioned above the photomask 111 at an oblique angle, to permit irradiation with the pellicles 112 on both sides of the photomask 111. In other embodiments, the light source 115 may be embedded within one or both of the pellicle holders 105 that directly contact pellicle 112 that includes frame 113, to irradiate the photomask throughout the pellicle mounting step.

Figure 5:
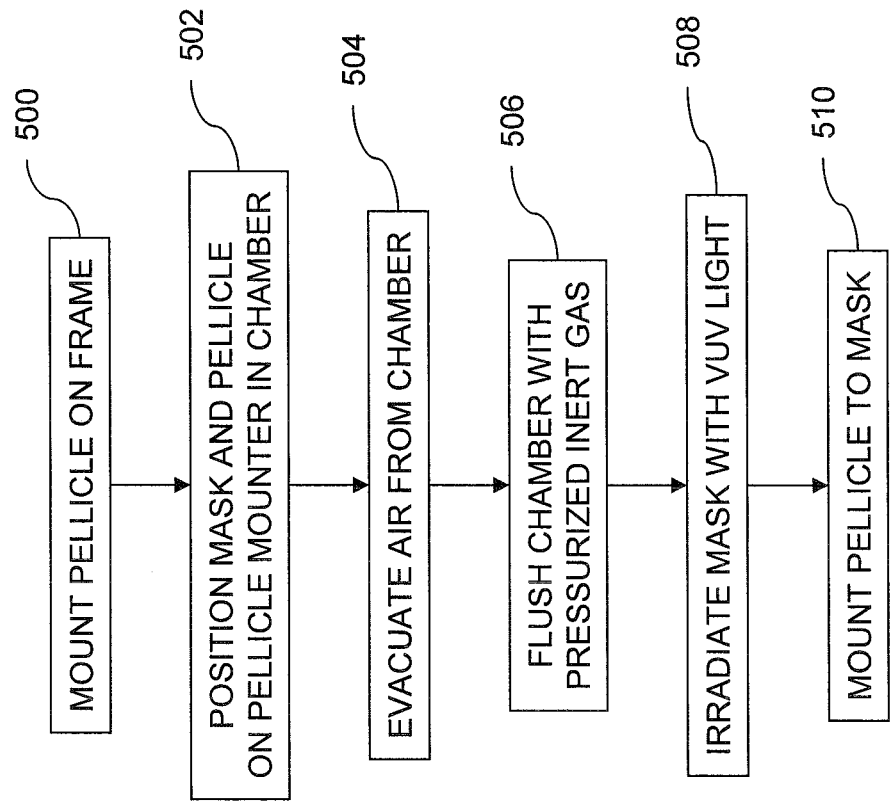
FIG. 5 is a flow chart of a method for mounting a pellicle to a mask.

FIG. 5 is a flow chart of a method for mounting a pellicle to a mask.

At step 500, a pellicle 112 is mounted to a pellicle frame 113.

At step 502, the mask 111 and pellicle 112 are positioned on the pellicle mounter within the chamber 116. The chamber is closed.

At step 504, the air 120 is evacuated from the chamber 116.

At step 506, the chamber 116 is flushed with pressurized XCDA or inert gas 117. The gas flow 117 can continue throughout the remainder of the mounting process.

At step 508, the mask 111 is irradiated with VUV light.

At step 510, the pellicle 112 is mounted to the mask 111, while the light source continues to provide VUV light and the inert gas is pumped into the chamber 116 under pressure. The adhesive between the mask 111 and the pellicle frame 113, and the adhesive between the pellicle frame 113 and the pellicle 112 form hermetic seals to maintain the inert gas under pressure within the space between the mask 111, pellicle 112 and frame 113.

By using the method of FIG. 5, haze is reduced or eliminated, and the risk of low wafer yield is reduced. The mask lifetime before repair is extended. Time is saved, because haze is reduced or eliminated, eliminating the need for frequent mask reworking (pellicle de-mounting, re-cleaning, defect inspection, CD measurement.) Expenses can be reduced.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An apparatus for mounting a pellicle to a photomask, the apparatus comprising:
a chamber having at least one port for filling the chamber with extreme clean dry air (XCDA) or an inert gas;
a pellicle mounter within the chamber, configured to mount a pellicle to a mask by directly attaching a frame of the pellicle to the mask with a pressure sensitive adhesive and including a duality of pellicle holders that directly contact the pellicle that includes the frame; and
a vacuum ultra violet light source for irradiating the mask held by the pellicle mounter while the chamber is filled with the XCDA or inert gas and while the frame is directly attached to the mask, the vacuum ultra violet light source embedded within one of the duality of pellicle holders.

2. The apparatus of claim 1, wherein the vacuum ultra violet light source provides light having a wavelength or 172 nm or 193 nm.

3. The apparatus of claim 2, wherein the vacuum ultra violet light source is a Xenon excimer laser.

4. The apparatus of claim 1, wherein the chamber is a sealable chamber.

5. The apparatus of claim 1, wherein the vacuum ultra violet light source is positioned to supply light at an oblique angle with respect to the mask while the mask is held by the pellicle mounter.

6. The apparatus of claim 5, wherein the chamber is sealable.

7. The apparatus of claim 1, wherein the pellicle mounter is capable of automatic operation.

8. The apparatus of claim 1, wherein:
the vacuum ultra violet light source is a Xenon excimer laser providing light with a wavelength of 172 nm,
the chamber has a first port for charging the chamber with XCDA or inert gas and a second port for evacuating the chamber,
the vacuum ultra violet light source is positioned to supply light at an oblique angle with respect to the mask while the mask is held by the pellicle mounter, and
the pellicle mounter is capable of automatic operation.

9. An apparatus for mounting a pellicle to a photomask, the apparatus comprising:
a chamber having at least one port for filling the chamber with extreme clean dry air (XCDA) or an inert gas;
a pellicle mounter within the chamber, configured to mount a pellicle to a mask by directly attaching a frame of the pellicle to the mask and including a duality of pellicle holders that directly contacts the pellicle that includes the frame; and
a vacuum ultra violet light source for irradiating the mask held by the pellicle mounter while the chamber is filled with the XCDA or inert gas and while the frame is directly attached to the mask, the vacuum ultra violet light source embedded within the duality of pellicle holders.

10. The apparatus of claim 9, wherein the chamber is a sealable chamber.

11. An apparatus for mounting a pellicle to a photomask, the apparatus comprising:
a sealable chamber having a duality of ports for filling and evacuating the chamber with extreme clean dry air (XCDA) or an inert gas, one of said ports including a gas valve;
a pellicle mounter within the chamber, configured to mount a pellicle to a mask by directly attaching a frame of the pellicle to the mask and including a mask holder and a pellicle holder on one side of the mask holder, a vacuum ultra violet (VUV) light source on an opposed side of the mask holder, and a transparent plate disposed between the mask holder and the VUV light source, said pellicle holder directly contacting the pellicle that includes the frame, the vacuum ultra violet light source for irradiating the mask held by the pellicle mounter while the chamber is filled with the XCDA or inert gas and while the frame is directly attached to the mask.

12. The apparatus of claim 11, wherein the vacuum ultra violet light source provides light having a wavelength or 172 nm or 193 nm.

13. The apparatus of claim 11, wherein the vacuum ultra violet light source is a Xenon excimer laser.

14. The apparatus of claim 11, wherein the vacuum ultra violet light source is positioned to supply light at an oblique angle with respect to the mask while the mask is held by the pellicle mounter.

15. The apparatus of claim 11, wherein the pellicle mounter is capable of automatic operation.

* * * * *